(12) United States Patent
Li

(10) Patent No.: US 11,955,563 B2
(45) Date of Patent: Apr. 9, 2024

(54) THIN FILM TRANSISTOR, MANUFACTURING METHOD OF THIN FILM TRANSISTOR, AND LIQUID CRYSTAL DISPLAY

(71) Applicant: WUHAN CHINA STAR OPTOELECTRONICS TECHNOLOGY CO., LTD., Hubei (CN)

(72) Inventor: Mingjuan Li, Hubei (CN)

(73) Assignee: WUHAN CHINA STAR OPTOELECTRONICS TECHNOLOGY CO., LTD., Hubei (CN)

(*) Notice: Subject to any disclaimer, the term of this patent is extended or adjusted under 35 U.S.C. 154(b) by 694 days.

(21) Appl. No.: 16/972,621

(22) PCT Filed: Mar. 29, 2019

(86) PCT No.: PCT/CN2019/080355
§ 371 (c)(1),
(2) Date: Dec. 7, 2020

(87) PCT Pub. No.: WO2020/124855
PCT Pub. Date: Jun. 25, 2020

(65) Prior Publication Data
US 2021/0242350 A1    Aug. 5, 2021

(30) Foreign Application Priority Data
Dec. 21, 2018  (CN) .......................... 201811568574.3

(51) Int. Cl.
*H01L 29/786* (2006.01)
*G02F 1/1368* (2006.01)
*H01L 29/66* (2006.01)

(52) U.S. Cl.
CPC ...... *H01L 29/78696* (2013.01); *G02F 1/1368* (2013.01); *H01L 29/66742* (2013.01); *H01L 29/78618* (2013.01); *H01L 29/78651* (2013.01)

(58) Field of Classification Search
None
See application file for complete search history.

(56) References Cited

U.S. PATENT DOCUMENTS

2008/0135837 A1    6/2008  Kim et al.
2008/0179600 A1*   7/2008  Takeguchi ........ H01L 29/78675
                                               257/E29.043

(Continued)

FOREIGN PATENT DOCUMENTS

CN    103296090 A    9/2013
CN    103594487 A    2/2014

(Continued)

*Primary Examiner* — Asok K Sarkar
(74) *Attorney, Agent, or Firm* — PV IP PC; Wei Te Chung; Zhigang Ma

(57) ABSTRACT

The present disclosure provides a thin film transistor, a manufacturing method of the thin film transistor, and a liquid crystal display. The thin film transistor includes a substrate; an active region arranged above the substrate; a channel region arranged in a center of the active region; source and drain regions arranged on two sides of the channel region; a gate dielectric layer arranged above the channel region; a reflective coating arranged above the gate dielectric layer; a gate metal arranged above the reflective coating; an interlayer dielectric layer covering the gate metal, the active region, and the substrate; and a source/drain metal layer passing through the interlayer dielectric layer and electrically connecting with a surface of the source and drain regions.

11 Claims, 3 Drawing Sheets

(56) References Cited

U.S. PATENT DOCUMENTS

2014/0048781 A1 2/2014 Chang
2016/0027853 A1 1/2016 Ahn et al.
2016/0181281 A1* 6/2016 Lee .................. H01L 29/78645
                                                    438/158

FOREIGN PATENT DOCUMENTS

| CN | 104916254 A | 9/2015 |
| CN | 106057909 A | 10/2016 |
| CN | 107329343 A | 11/2017 |
| CN | 109003943 A | 12/2018 |
| KR | 20130023980 A | 3/2013 |

* cited by examiner

THIN FILM TRANSISTOR, MANUFACTURING METHOD OF THIN FILM TRANSISTOR, AND LIQUID CRYSTAL DISPLAY

BACKGROUND

Field

The present disclosure relates to a technical field of electronic display devices, and more particularly to a thin film transistor, a manufacturing method of the thin film transistor, and a liquid crystal display.

Background

With the development of the liquid crystal display technology and to optimize the appearance of the liquid crystal display, the thickness of the liquid crystal display becomes more and more thinner. In order to further reduce the thickness of the liquid crystal display, a liquid crystal display with a type of side light-emitting gradually replaces a liquid crystal display with a type of bottom light-emitting and becomes a mainstream display. In the liquid crystal display with the type of side light-emitting, a backlight source is disposed on the two sides of the liquid crystal display, and a backlight reflection plate is arranged below the liquid crystal display, the light emitted by the side light source is reflected by the backlight reflection plate and emitted to the liquid crystal display to serve as a backlight source of the liquid crystal display.

In a liquid crystal display, the light transmittance of the liquid crystal display is an important parameter for determining the quality of the liquid crystal display. In the liquid crystal display with the type of side light-emitting, most of the structure of a thin film transistor layer above the backlight reflecting plate is light transmissive, but a gate metal layer formed by material of aluminum or molybdenum is opaque. Therefore, one part of light reflected to the liquid crystal display from the backlight reflection plate directly passes through a light transmissive region of the thin-film transistor layer and illuminates the liquid crystal and a color film layer on an upper layer. The other part of light emitted to an opaque region of the thin film transistor layer may be shielded by the metal layer and cannot reach the liquid crystal and the color film layer on the upper layer. In general, because the metal layer has the characteristic of light reflection, the metal layer is able to reflect the light back to the backlight reflection plate and the backlight reflection plate reflects the light for emitting the light to the thin film transistor layer again.

The light reflection capacity of the gate metal layer in the prior art is less than 20%. The light emitted to the gate metal layer cannot be reflected, thereby reducing transmittance rate of the liquid crystal display and affecting the product quality.

SUMMARY OF THE DISCLOSURE

The present disclosure provides a thin film transistor, a manufacturing method of the thin film transistor, and a liquid crystal display, thereby improving light transmittance rate of the liquid crystal display.

In an embodiment, the present disclosure provides a thin-film transistor, comprising:
a substrate;
an active region arranged above the substrate;
a channel region arranged in a center of the active region;
source and drain regions arranged on two sides of the channel region;
a gate dielectric layer arranged above the channel region;
a reflective coating arranged above the gate dielectric layer;
a gate metal arranged above the reflective coating;
an interlayer dielectric layer covering the gate metal, the active region, and the substrate; and
a source/drain metal layer passing through the interlayer dielectric layer and electrically connecting with a surface of the source and drain regions.

In an embodiment of the thin film transistor, a reflectivity of the reflective coating to visible light is greater than or equal to 80%.

In an embodiment of the thin film transistor, the reflective coating is a metal with a mirror surface structure.

In an embodiment of the thin film transistor, material of the reflective coating is silver or aluminum.

In an embodiment, the present disclosure provides a manufacturing method of the thin film transistor, comprising the steps:
providing a substrate;
forming an active region on the substrate;
forming a channel region arranged in a center of the active region;
forming source and drain regions arranged on two sides of the channel region;
forming a gate dielectric layer arranged above the channel region;
forming a reflective coating above the gate dielectric layer;
forming a gate metal arranged above the reflective coating;
forming an interlayer dielectric layer that covers the gate metal, the active region, and the substrate; and
forming a source/drain metal layer passes through the interlayer dielectric layer and electrically connecting with a surface of the source and drain regions.

In an embodiment of the manufacturing method of the thin film transistor, the step of forming the gate dielectric layer arranged above the channel region further comprises:
forming a sacrificial dielectric layer above the channel region, wherein the sacrificial dielectric layer is made of silicon oxide or silicon nitride, and thickness of the sacrificial dielectric layer is greater than or equal to twice of thickness of the gate dielectric layer; and
polishing the sacrificial dielectric layer by chemical mechanical polishing, wherein a part of the sacrificial dielectric layer is removed, such that thickness of remaining sacrificial dielectric layer is equal to the thickness of the gate dielectric layer for forming the gate dielectric layer;
wherein a surface of the gate dielectric layer is a polished surface.

In an embodiment of the manufacturing method of the thin film transistor, a reflectivity of the reflective coating to visible light is greater than or equal to 80%.

In an embodiment of the manufacturing method of the thin film transistor, the reflective coating is a metal with a mirror surface structure, and wherein the step of forming the reflective coating above the gate dielectric layer further comprises:
forming the metal with the mirror surface structure on the polished surface by an electroplating method.

In an embodiment of the manufacturing method of the thin film transistor, material of the reflective coating is silver or aluminum.

In an embodiment, the present disclosure provides a liquid crystal display comprising a thin film transistor array, wherein the thin film transistor array comprises a plurality of thin film transistors which are electrically connected with each other, each of the thin film transistors comprising:
a substrate;
an active region arranged above the substrate;
a channel region arranged in a center of the active region;
source and drain regions arranged on two sides of the channel region;
a gate dielectric layer arranged above the channel region;
a reflective coating arranged above the gate dielectric layer;
a gate metal arranged above the reflective coating;
an interlayer dielectric layer covering the gate metal, the active region, and the substrate; and
a source/drain metal layer passing through the interlayer dielectric layer and electrically connecting with a surface of the source and drain regions.

In an embodiment of the liquid crystal display, the reflectivity of the reflective coating to the visible light is greater than or equal to 80%.

In an embodiment of the liquid crystal display, the reflective coating is a metal with a mirror surface structure.

In an embodiment of the liquid crystal display, material of the reflective coating is silver or aluminum.

According to the present disclosure, an opaque region, e.g., the gate metal, of the thin film transistor of the side light-emitting type of liquid crystal display includes a reflection coating with a high reflectivity, and most of the light emitted to the gate metal can be reflected back to the backlight reflection plate in the bottom. For example, the light is emitted to a light-emitting region after the light is reflected twice, such that the light is not absorbed by the opaque region, thereby avoiding the loss of the light. According to the liquid crystal display of the present disclosure, the reflectivity of the opaque region of the thin film transistor of the liquid crystal display is increased, such that the light transmittance of the liquid crystal display is increased and the performance of the liquid crystal display is improved.

BRIEF DESCRIPTION OF THE DRAWINGS

The following embodiments refer to the accompanying drawings for exemplifying specific implementable embodiments of the present disclosure in a suitable computing environment. It should be noted that the exemplary described embodiments are configured to describe and understand the present disclosure, but the present disclosure is not limited thereto.

DETAILED DESCRIPTION OF THE PREFERRED EMBODIMENTS

The following embodiments refer to the accompanying figures for exemplifying specific implementable embodiments of the present disclosure in a suitable environment. It should be noted that the exemplary described embodiments are configured to describe and understand the present disclosure, but the present disclosure is not limited thereto. Directional terms, such as an upper side, a lower side, a front side, a back side, a left side, a right side, an inner side, an outer side, and a lateral side, mentioned in the present disclosure are only for reference. Therefore, the directional terms are used for describing and understanding rather than limiting the present disclosure. In the figures, units having similar structures are used for the same reference numbers.

A liquid crystal display in the prior art is briefly described.

Figure 1:
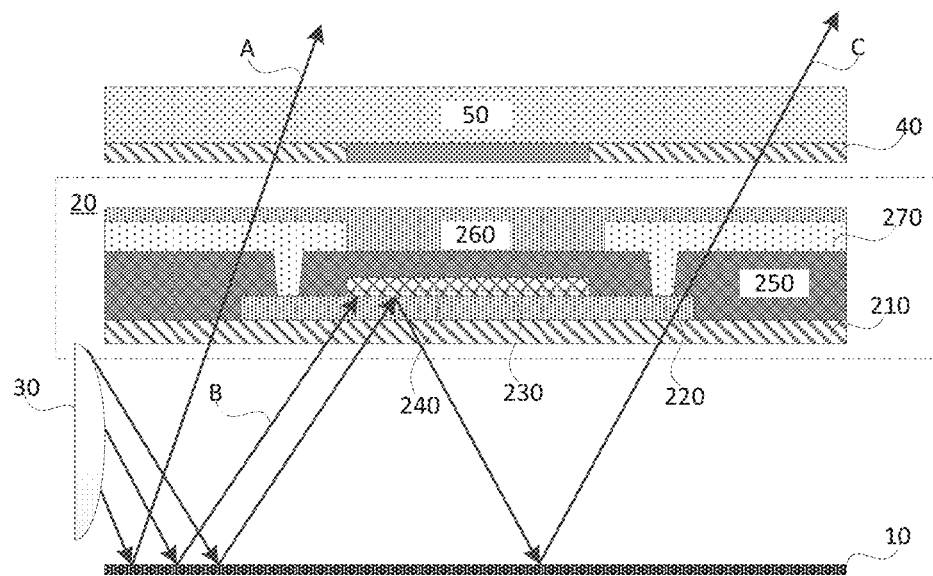
FIG. 1 is a schematic structural diagram of a side-emitting type of liquid crystal display in the prior art.

Referring to FIG. 1, FIG. 1 is a schematic structural diagram of a side-emitting type of liquid crystal display in the prior art. The liquid crystal display includes a backlight reflection plate 10, a thin film transistor layer 20, a side backlight source 30, a color film layer 40, and a packaging layer 50.

The reflectivity of the backlight reflection plate 10 to visible light is greater than 90%. The backlight reflection plate 10 is made of metal, i.e., silver or aluminum, with a crystal surface structure, where the reflectivity of the metal silver on the surface structure is greater than 99% and the light loss can be reduced.

The thin film transistor layer 20 includes a substrate 210, an active region 220 arranged above the substrate 210, a gate dielectric layer 230 arranged above the active region 220, and a gate metal 240 arranged above the gate dielectric layer 230, an interlayer dielectric layer 250 covering the gate metal 240 and the active region 220, a source/drain metal layer 270 passing through the interlayer dielectric layer 250 and electrically connected with the active region 220, and a pixel definition layer 260 covering the gate dielectric layer 250 and the source/drain metal layer 270.

The active region 220 includes a channel region arranged in the center of the active region 220 and source and drain regions arranged on two sides of the channel region. The gate dielectric layer 230 and the gate metal 240 are arranged above the channel region.

The color film layer 40 is arranged above the pixel definition layer 260. The thin film transistor layer 20 and the color film layer 40 are also provided with a liquid crystal layer (not shown). The packaging layer 50 is arranged above the color film layer 40. The packaging layer 50 is integrated with a touch control element for a touch control function.

The side backlight source 30 is arranged on two sides of the gap between the backlight reflection plate 10 and the thin film transistor layer 20. The light is projected onto the backlight reflecting plate 10. Light is transmitted to the thin film transistor layer 20 after the light is reflected by the backlight reflection plate 10, to serve as the backlight.

In the thin film transistor layer 20, the gate metal includes aluminum or molybdenum, and is opaque. Therefore, one part, i.e., light A, of the reflected light directly passes through a light transmissive region of the thin-film transistor layer 20 and illuminates the liquid crystal and a color film layer 40 on an upper layer. The other part, i.e., light B, of light emitted to an opaque region of the thin film transistor layer 20 may be shielded by the metal layer and cannot reach the liquid crystal and the color film layer 40 on the upper layer. In general, because the metal layer has the characteristic of light reflection, the metal layer is able to reflect the light back to the backlight reflection plate and the backlight reflection plate reflects the light for emitting the light, i.e., light C, to the thin film transistor layer again. The light reflection capacity of the gate metal layer in the prior art is less than 20%. The light emitted to the gate metal layer cannot be reflected, thereby reducing transmittance rate of the liquid crystal display and affecting the product quality.

Figure 2:
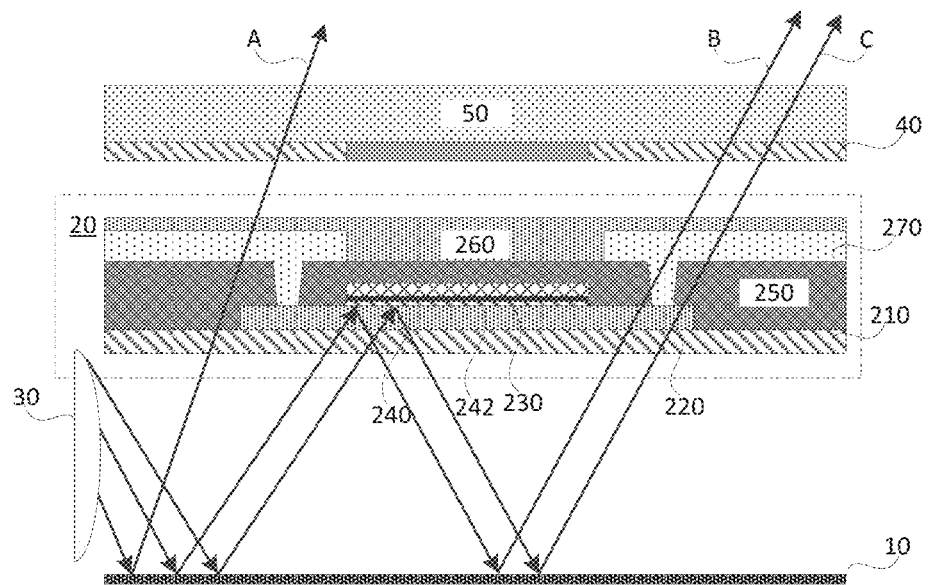
FIG. 2 is a schematic structural diagram of a side-emitting type of liquid crystal display according to an embodiment of the present disclosure.

The present disclosure provides a thin film transistor, a manufacturing method of the thin film transistor, and a liquid crystal display to improve the light transmittance of the liquid crystal display. Referring to FIG. 2, FIG. 2 is a schematic structural diagram of a side-emitting type of the liquid crystal display according to an embodiment of the present disclosure. The liquid crystal display includes a backlight reflection plate 10 and a thin film transistor layer 20, a side backlight source 30, a color film layer 40, and a packaging layer 50.

Different from the side-emitting type of liquid crystal display in the prior art in FIG. 1, the thin film transistor 20 of the present disclosure includes a substrate 210, an active region 220 arranged above the substrate 210, a channel region arranged in the center of the active region 220, source and drain regions arranged on two sides of the channel region, a gate dielectric layer 230 arranged above the channel region, a reflective coating 242 arranged above the gate dielectric layer 230, a gate metal 240 arranged above the reflective coating, an interlayer dielectric layer 250 covering the gate metal 240, the active region 220 and the substrate 210, a source/drain metal layer 270 passing through the interlayer dielectric layer 250 and electrically connected with the surface of the source and drain regions, and a pixel definition layer 260 covering the gate dielectric layer 250 and the source/drain metal layer 270, e.g., a metal plugs.

In an embodiment, the reflectivity of the reflective coating 242 to visible light is greater than or equal to 80%. Preferably, the reflective coating 242 is a metal with a mirror surface structure. In an embodiment, material of the reflective coating 242 is metal, e.g., silver or aluminum.

Figure 3:
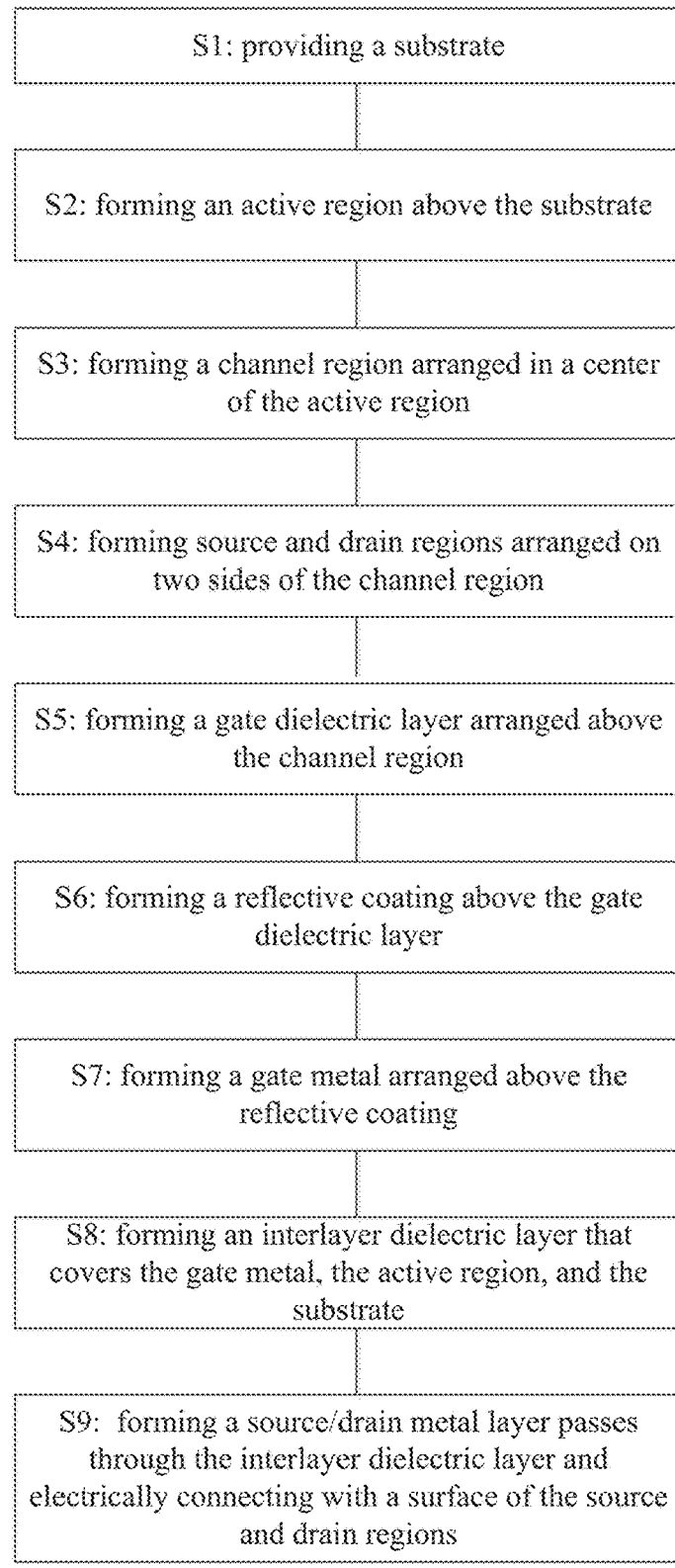
FIG. 3 is a flowchart of a method of manufacturing a thin film transistor according to an embodiment of the present disclosure.

Referring to FIG. 2 and FIG. 3, FIG. 3 is a flowchart of a method for manufacturing a thin film transistor according to an embodiment of the present disclosure. The present disclosure further provides a manufacturing method of the thin film transistor 20. The method includes the following steps:

At a step S1, a substrate 210 is provided.

At a step S2, an active region 220 above the substrate 210 is formed.

At a step S3, a channel region arranged in a center of the active region 220 is formed.

At a step S4, source and drain regions arranged on two sides of the channel region are formed.

At a step S5, a gate dielectric layer 230 above the channel region is formed.

At a step S6, a reflective coating 242 above the gate dielectric layer 230 is formed.

At a step S7, a gate metal 240 above the reflective coating 242 is formed.

At a step S8, an interlayer dielectric layer 250 is formed for covering the gate metal 240, the active region 220, and the substrate 210.

At a step S9, the source/drain metal layer 270 is formed for passing through the interlayer dielectric layer 250 and electrically connecting the surface of the source and drain regions.

In an embodiment, the reflectivity of the reflective coating 242 to visible light is greater than or equal to 80%. Preferably, the reflective coating 242 is a metal with a mirror surface structure. In an embodiment, material of the reflective coating 242 is metal, e.g., silver or aluminum.

In an embodiment of the step S5, the method for forming the gate dielectric layer 230 above the channel region includes following steps. A sacrificial dielectric layer is formed above the channel region, where the sacrificial dielectric layer is made of silicon oxide or silicon nitride, and the thickness of the sacrificial dielectric layer is greater than or equal to twice of the thickness of the gate dielectric layer. The sacrificial dielectric layer is polished by using a chemical mechanical polishing method to remove a part of the sacrificial dielectric layer, such that the thickness of the remaining sacrificial dielectric layer is equal to the thickness of the gate dielectric layer for forming the gate dielectric layer 230, where the surface of the gate dielectric layer 230 is a polished surface.

In an embodiment, the gate dielectric layer 230 is formed by a chemical mechanical polishing method, such that the gate dielectric layer 230 includes a smooth surface. The reflective coating 242 with a mirror surface structure is formed above the gate dielectric layer 230, such that the reflection rate of the reflective coating 242 can be further improved.

In an embodiment of the step S6, the method for forming the reflective coating 242 above the gate dielectric layer 230 includes following steps. A metal layer with a mirror surface structure is formed on the polishing surface by an electroplating method. When the electroplating method is performed, the surface of the metal layer forms a smooth mirror surface and the light reflection rate of the metal layer is enhanced. In an embodiment, material of the reflective coating 242 is metal, e.g., silver or aluminum.

In an embodiment of the present disclosure, the present disclosure further provides a liquid crystal display. The liquid crystal display includes a thin film transistor array and the thin film transistor array includes a plurality of thin film transistors which are electrically connected with each other. Each of the thin film transistors of the present disclosure includes a substrate 210, an active region 220 arranged above the substrate 210, a channel region arranged in the center of the active region 220, source and drain regions arranged on two sides of the channel region, a gate dielectric layer 230 arranged above the channel region, a reflective coating 242 arranged above the gate dielectric layer 230, a gate metal 240 arranged above the reflective coating, an interlayer dielectric layer 250 covering the gate metal 240, the active region 220 and the substrate 210, a source/drain metal layer 270 passing through the interlayer dielectric layer 250 and electrically connected with the surface of the source and drain regions, and a pixel definition layer 260 covering the gate dielectric layer 250 and the source/drain metal layer 270, e.g., a metal plugs.

According to the present disclosure, an opaque region, e.g., the gate metal, of the thin film transistor of the side light-emitting type of liquid crystal display includes a reflection coating with a high reflectivity, and most of the light emitted to the gate metal can be reflected back to the backlight reflection plate in the bottom. For example, the light is emitted to a light-emitting region after the light is reflected twice, such that the light is not absorbed by the opaque region, thereby avoiding the loss of the light. According to the liquid crystal display of the present disclosure, the reflectivity of the opaque region of the thin film transistor of the liquid crystal display is increased, such that the light transmittance of the liquid crystal display is increased and the performance of the liquid crystal display is improved.

As is understood by a person skilled in the art, the foregoing preferred embodiments of the present disclosure are illustrative rather than limiting of the present disclosure. It is intended that they cover various modifications and similar arrangements be included within the spirit and scope of the present disclosure, the scope of which should be accorded the broadest interpretation so as to encompass all such modifications and similar structures.

What is claimed is:

1. A thin film transistor, comprising:
a substrate;
an active region arranged above the substrate;
a channel region arranged in a center of the active region;
source and drain regions arranged on two sides of the channel region;
a gate dielectric layer arranged above the channel region;
a reflective coating arranged above the gate dielectric layer;
a gate metal arranged above the reflective coating;
an interlayer dielectric layer covering the gate metal, the active region, and the substrate; and
a source/drain metal layer passing through the interlayer dielectric layer and electrically connecting with a surface of the source and drain regions;
wherein the reflective coating and the gate metal are different layers;
wherein the reflective coating is a metal with a mirror surface structure.

2. The thin film transistor according to claim 1, wherein a reflectivity of the reflective coating to visible light is greater than or equal to 80%.

3. The thin film transistor according to claim 1, wherein material of the reflective coating is silver or aluminum.

4. A manufacturing method of the thin film transistor, comprising the steps:
providing a substrate;
forming an active region on the substrate;
forming a channel region arranged in a center of the active region;
forming source and drain regions arranged on two sides of the channel region;
forming a gate dielectric layer arranged above the channel region;
forming a reflective coating above the gate dielectric layer;
forming a gate metal arranged above the reflective coating;
forming an interlayer dielectric layer that covers the gate metal, the active region, and the substrate; and
forming a source/drain metal layer passes through the interlayer dielectric layer and electrically connecting with a surface of the source and drain regions;
wherein the reflective coating and the gate metal are different layers;
wherein the reflective coating is a metal with a mirror surface structure.

5. The manufacturing method of the thin film transistor according to claim 4, wherein the step of forming the gate dielectric layer arranged above the channel region further comprises:
forming a sacrificial dielectric layer above the channel region, wherein the sacrificial dielectric layer is made of silicon oxide or silicon nitride, and thickness of the sacrificial dielectric layer is greater than or equal to twice of thickness of the gate dielectric layer; and
polishing the sacrificial dielectric layer by chemical mechanical polishing, wherein a part of the sacrificial dielectric layer is removed, such that thickness of remaining sacrificial dielectric layer is equal to the thickness of the gate dielectric layer for forming the gate dielectric layer;
wherein a surface of the gate dielectric layer is a polished surface.

6. The manufacturing method of the thin film transistor according to claim 5, wherein a reflectivity of the reflective coating to visible light is greater than or equal to 80%.

7. The manufacturing method of the thin film transistor according to claim 6, wherein the step of forming the reflective coating above the gate dielectric layer further comprises:
forming the metal with the mirror surface structure on the polished surface by an electroplating method.

8. The manufacturing method of the thin film transistor according to claim 7, wherein material of the reflective coating is silver or aluminum.

9. A liquid crystal display comprising a thin film transistor array, wherein the thin film transistor array comprises a plurality of thin film transistors which are electrically connected with each other, each of the thin film transistors comprising:
a substrate;
an active region arranged above the substrate;
a channel region arranged in a center of the active region;
source and drain regions arranged on two sides of the channel region;
a gate dielectric layer arranged above the channel region;
a reflective coating arranged above the gate dielectric layer;
a gate metal arranged above the reflective coating;
an interlayer dielectric layer covering the gate metal, the active region, and the substrate; and
a source/drain metal layer passing through the interlayer dielectric layer and electrically connecting with a surface of the source and drain regions;
wherein the reflective coating and the gate metal are different layers;
wherein the reflective coating is a metal with a mirror surface structure.

10. The liquid crystal display according to claim 9, wherein the reflectivity of the reflective coating to visible light is greater than or equal to 80%.

11. The liquid crystal display according to claim 9, wherein material of the reflective coating is silver or aluminum.

* * * * *